United States Patent
Nishiyama

(10) Patent No.: US 6,841,454 B2
(45) Date of Patent: Jan. 11, 2005

(54) CHIP-LIKE ELECTRONIC COMPONENTS, A METHOD OF MANUFACTURING THE SAME, A PSEUDO WAFER THEREFOR AND A METHOD OF MANUFACTURING THEREOF

(75) Inventor: Kazuo Nishiyama, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/216,508

(22) Filed: Aug. 9, 2002

(65) Prior Publication Data

US 2002/0192867 A1 Dec. 19, 2002

Related U.S. Application Data

(62) Division of application No. 09/843,630, filed on Apr. 27, 2001.

(30) Foreign Application Priority Data

Apr. 28, 2000 (JP) ......................................... 2000-130001

(51) Int. Cl.[7] .......................... H01L 21/00; H01L 21/44; H01L 21/30
(52) U.S. Cl. ....................... 438/458; 438/459; 438/460; 438/118; 438/106; 438/113; 438/110; 438/68
(58) Field of Search ................................. 438/458, 459, 438/460, 118, 106, 113, 110, 68

(56) References Cited

U.S. PATENT DOCUMENTS

| | | | |
|---|---|---|---|
| 4,931,853 A | | 6/1990 | Ohuchi et al. |
| 5,032,543 A | | 7/1991 | Black et al. |
| 5,422,514 A | * | 6/1995 | Griswold et al. ........... 257/679 |
| 5,434,094 A | * | 7/1995 | Kobiki et al. ............... 438/167 |
| 5,600,181 A | | 2/1997 | Scott et al. |
| 5,786,628 A | | 7/1998 | Beilstein, Jr. et al. |
| 5,796,164 A | | 8/1998 | McGraw et al. |
| 5,874,774 A | | 2/1999 | Takahashi |
| 5,942,578 A | | 8/1999 | Noguchi et al. |
| 5,956,236 A | | 9/1999 | Corisis et al. |
| 5,989,982 A | * | 11/1999 | Yoshikazu ................. 438/462 |
| 6,104,089 A | | 8/2000 | Akram |
| 6,174,751 B1 | | 1/2001 | Oka |
| 6,242,283 B1 | | 6/2001 | Lo et al. |
| 6,291,884 B1 | | 9/2001 | Glenn et al. |
| 6,344,401 B1 | | 2/2002 | Lam |
| 6,348,728 B1 | | 2/2002 | Aiba et al. |
| 6,373,133 B1 | | 4/2002 | DiGiacomo et al. |
| 6,445,591 B1 | | 9/2002 | Kwong |
| 6,518,662 B1 | | 2/2003 | Smith et al. |
| 6,555,906 B2 | * | 4/2003 | Towie et al. ................. 257/723 |
| 2001/0018229 A1 | * | 8/2001 | Kato et al. .................. 438/106 |
| 2001/0039078 A1 | | 11/2001 | Schroen |
| 2002/0072202 A1 | * | 6/2002 | Odashima et al. .......... 438/460 |
| 2003/0003688 A1 | * | 1/2003 | Tandy et al. ............... 438/459 |

FOREIGN PATENT DOCUMENTS

| | | |
|---|---|---|
| EP | 0611129 | 8/1994 |
| FR | 2572849 | 11/1994 |
| JP | 05-090559 | 9/1993 |
| JP | 06-163808 | 10/1994 |
| JP | 2001-110828 | 4/2001 |

* cited by examiner

Primary Examiner—Kamand Cuneo
Assistant Examiner—James M. Mitchell
(74) Attorney, Agent, or Firm—Robert J. Depke; Holland & Knight LLP

(57) ABSTRACT

In order to have a thin type semiconductor chips featuring a high yield and a low cost in production, an excellent packaging reliability, and a robust structure against damages, there is provided a method of manufacturing LSI chips, comprising the steps of: pasting on a substrate an adhesive sheet which retains its adhesive strength prior to a processing, then loses it after the processing; bonding non-defective LSI chips on the adhesive sheet, with their device surfaces facing downward; uniformly coating an insulating film on the non-defective LSI chips; uniformly grinding the insulating film to a level of the bottom surfaces of these LSI chips; applying a predetermined process to the adhesive sheet to weaken its adhesive strength thereof so as to peel off a pseudo wafer on which the non-defective LSI chips are bonded; and dicing the LSI chips into a discrete non-defective electronic component by cutting the pseudo wafer.

13 Claims, 12 Drawing Sheets

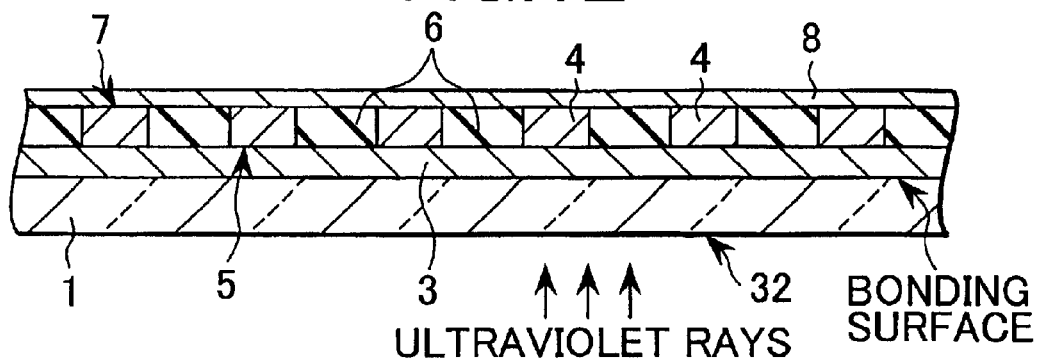
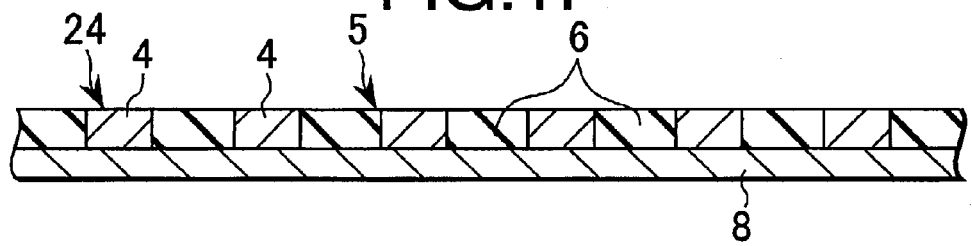
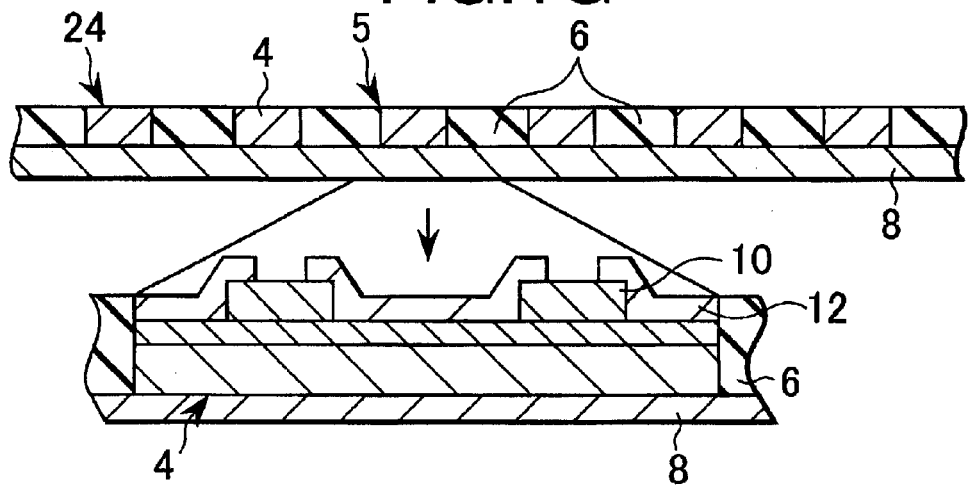
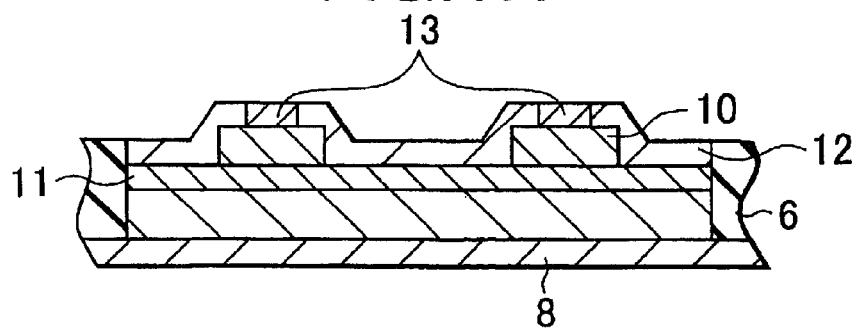

○ : NON-DEFECTIVE CHIP

✕ : DEFECTIVE CHIP

GRIND/POLISH

CHIP-LIKE ELECTRONIC COMPONENTS, A METHOD OF MANUFACTURING THE SAME, A PSEUDO WAFER THEREFOR AND A METHOD OF MANUFACTURING THEREOF

The present application is a divisional of U.S. application Ser. No. 09/843,630 filed Apr. 27, 2001, which claims priority to Japanese P2000-130001 filed Apr. 28, 2000. The present application claims priority to each of these previously filed applications.

RELATED APPLICATION DATA

The present application claims priority to Japanese Application No. P2000-130001 filed Apr. 28, 2000, which application is incorporated herein by reference to the extent permitted by law.

BACKGROUND OF THE INVENTION

The present invention relates to a chip-like electronic component suitable for use in the manufacture of a semiconductor device and a method of manufacturing the same, and in particular, it relates to a pseudo wafer for use in the manufacture of the same and a method therefor.

Recently, in line with a recent growing demand for a more compact and lightweight design of electronic devices typically represented by a portable information terminal and the like, a very high density packaging technology for packaging semiconductor LSIs (large-scaled integration) in a limited space is attracting much attention.

Conventional high density packaging technology has been challenging how to improve a surface packaging density mainly, and there have been many discussions on a more compact package design, chip scale packaging (CSP), a real chip size CSP using a flip chip connection, and a bare chip packaging technology. Although it is a key point of the discussion at the same time to realize minimization of a gap between respective CSPs or bare chips in the high density packaging, nevertheless how many bare chips are packaged on a surface with a gap therebetween minimized infinitely, a packaging area thereof on a substrate cannot exceed 100%.

By way of example, as a typical bump forming technique in the above-mentioned flip chip packaging method, there are a method for forming Au bumps on an Al electrode pad by using the Au-stud bump process or the electroplating process, and a method for forming solder bumps in batch by using the electroplating process or the vapor deposition process. However, in a commercial application where a low cost flip chip packaging is preferred, it is advantageous not to form bumps after the chip is fabricated as in the Au stud bump method, but to form bumps in batch in its preceding stage of the wafer.

This wafer batch processing method described above clearly indicates a trend of technology in the future in consideration of a recent advancement of large scaled wafers (from 150 mm$\phi$ to 200 mm$\phi$ and to 300 mm$\phi$), and an increasing number of chip connection pins in LSIs (large scaled integrated-circuits).

Recently, as a further challenge to an improved high-density packaging technology, a three dimensional packaging technology typically represented by a stack packaging or a lamination packaging are being discussed in many related companies.

FIGS. 10A–10C show examples of three-dimensional packaging, in which FIG. 10A shows a stacked packaging based on a wire bonding method wherein each of two semiconductor chips 56 stacked and bonded via an epoxy resin 55 is electrically connected to a circuit board 57 with a wire 54.

Further, FIG. 10B shows another packaging method that combines the flip chip method and the wire bonding method, wherein an upper semiconductor chip 56 and a lower semiconductor chip 56 are physically and electrically coupled via a bump electrode 59 and an under fill material 58 which is sealed in the periphery of the bump electrode 59. Still further, the under semiconductor chip 56 and a circuit board 57 are electrically connected with a wire 54.

Furthermore, FIG. 10C shows still another stacked structure, wherein each semiconductor chip 56 is coupled to an interposer 60 via an under fill material 58 and a bump electrode 59, and wherein a plurality of the interposers 60 and a plurality of solder balls 69 are stacked one by one on a circuit board 57, and respective interposers 60 are electrically connected with each other and to the circuit board 57 via solder balls 69.

Although FIG. 10C is a diagram showing an example of stacked packaging of semiconductor LSIs via a plurality of interposers 60, there is a problem that as the number of stacked semiconductor LSIs increases, a height of a stacked package increases. As a result, because a demand for a thinner packaging thereof becomes greater, a thinner design of LSI chips becomes more important.

Normally, a typical semiconductor LSI has a thickness of 600 $\mu$m to 700 $\mu$m in a wafer level, then a circuit thereof is formed by the processes of patterning, oxidization, impurity impregnation, wiring processing and the like, and after grinding the wafer into a thickness of approximately 400 $\mu$m, it is diced into each chip.

For example, in a stacked packaging which stacks LSI chips each having a thickness of 400 $\mu$m into four stages of lamination, a total thickness thereof will become approximately 2 mm. Now, research and developments for reducing a thickness of LSI chips as thin as 200 $\mu$m, 100 $\mu$m or even 50 $\mu$m are in progress. Still further, an extra high density stacked packaging technology using a thinner type LSI chip is advancing, which features a packaging efficiency in excess of 100% and a low package height.

By way of example, in order to obtain a thinner LSI chip, it is a normal practice to grind the chip in a state of a wafer to reduce the thickness thereof, and then dice into each chip. This method will be described with reference to FIGS. 11A–11E in the following.

FIG. 11A shows an LSI wafer 61 with its device surface 62 facing upward, which has normally a thickness of 600 $\mu$m to 700 $\mu$m. FIG. 11B shows the LSI wafer 61 having a protection sheet 63 pasted on its device surface 62. FIG. 11C shows the LSI wafer 61 which was ground and polished on its bottom surface 68 in order to reduce its thickness. After grinding and polishing to reduce the thickness, the LSI wafer 61 is subjected to a cleaning process, however, at this time, a delicate handling and care must be taken (when peeling off the protection sheet 63 or handling of the LSI wafer 61) lest a very thin LSI wafer 61 should be broken.

Next, in FIG. 11D, the protection sheet 63 is peeled off from the LSI wafer 61, and a dicing sheet 64 is pasted on a bottom surface 68 thereof. Further, FIG. 11E shows a step of fabricating LSI chips 65 through a dicing process by dicing the LSI wafer 61 into respective chips. By way of example, there is a problem that a crack tends to occur easily when the thickness of the LSI chip 65 which was ground becomes thinner at the time of dicing of the LSI wafer 61.

On the other hand, recently, a new technology called as "DBG (dicing before grinding)" is introduced and drawing attention as a new grinding method which minimizes cracks of LSI chip 65 and is capable of reducing the thickness thereof.

FIGS. 12A–12E show the so-called "DBG (dicing before grinding)" method. FIG. 12A shows the LSI wafer 61 with its device surface 62 facing upward. FIG. 12B shows an LSI wafer 61 having a dicing sheet 64 pasted on its bottom surface 68. In FIG. 12C, the LSI wafer 61 having a thickness of 600 $\mu$m, for example, is subjected to a half-dicing to cut into a depth of, for example, 200 $\mu$m from a device surface 62 with a blade 66 or the like.

In FIG. 12D, the dicing sheet 64 is removed from the bottom surface 68 of the LSI wafer 61, and a re-pasting protection sheet 67 is pasted on the device surface 62 which was applied the half-dicing. Then, in FIG. 12E, grinding and polishing of the LSI wafer 61 is applied from the bottom surface 68 thereof to fabricate the LSI wafer 61 into respective chips. As a result, a very thin LSI chip 65 having a thickness of 100 $\mu$m or less and a minimum chip crack is easily obtained according to the present invention.

Now, the above-mentioned CSP (chip scale package) which is an approach to a high density packaging of LSIs by minimizing sizes of respective chips thereof is comprised of several common circuit blocks as viewed from the standpoint of a digital device circuit block diagram, and there is also emerging such a process to provide these common circuit blocks in a multi package or in a MCM (multi chip module). Provision of SRAM (static RAM), flash memory and a microcomputer in one chip package in a digital portable telephone is one example thereof.

This MCM technology is expected to attain a significant advantage also in a one-chip system LSI of a recent development. Namely, when integrating a group of memory, logic and analog LSIs on one chip, different LSI fabrication processes must be handled in a same wafer processing stage, thereby substantially increasing the number of masks and processing steps, with its TAT (turnaround time) for development being prolonged. Also, a low yield in production resulting from the increased steps of processing is a serious problem which cannot be ignored. For this reason, it is considered to be promising to fabricate respective LSIs individually, and then package them in an MCM.

FIG. 9 indicates a semiconductor wafer 61 fabricated by a conventional wafer batch processing. Despite a high yield of production is required for the leading-edge LSIs, the number of defective chips 29 partitioned by a scribe line 70 and marked with "x" is actually greater than the number of non-defective chips 30 marked with "○".

On the other hand, the wafer batch solder bump forming process is advantageous in terms of packaging because it can be applied to the provision of an area pad, and enables a batch reflow or a double side mounting. However, it has a disadvantage when being applied to the processing of a leading-edge wafer 61 which normally has a low yield of production, and because a cost of production per non-defective chip 30 will substantially increase.

Further, there has been such a problem that if bare chips are purchased from the other manufacturers or venders, it is extremely difficult to form bumps on them due to a varied design specification. Namely, although the above-mentioned two types of bump forming methods have their own merits, they cannot be used in all fields. Therefore, the above-mentioned wafer batch bump forming method is advantageous for use in such a case where the number of terminals accommodated within a single wafer is large (for example, 50000 terminals/wafer), or for forming low damage bumps applicable to the area pad.

Further, when the semiconductor wafer 61 indicated in FIG. 9 is diced along the scribe line 70, a damage such as a stress or a crack occurs in the chip due to its dicing, which may lead to a failure. Furthermore, if a process of forming solder bumps in batch on the semiconductor wafer 61 which includes both the conforming chips 30 and the defective chips 29 is allowed to proceed, the process applied to the defective chips 29 is wasted, thereby increasing the cost of manufacture.

In Japanese Patent Application Publication Laid-Open Number 9-260581, a method of forming a wiring layer for interconnection between devices is disclosed wherein a plurality of semiconductor chips are firmly bonded on a silicon wafer, embedded into a resin formed on a substrate made of alumina or the like under pressure, then peeled off so as to provide a flat wafer surface and form the wiring layer for interconnection between the devices on this flat wafer surface by photolithography.

According to this conventional method, although it is proposed that a wafer batch processing becomes possible and a low cost manufacture thereof by a merit of mass production is attained, however, because there exists a hard substrate made of alumina under the bottom surfaces of these semiconductor chips which are arrayed on the wafer, at the time of scribing and cutting into each dice, the hard substrate present under the bottom surfaces of the chips must be cut together with the resin between adjacent chips, thereby likely to damage a cutter blade. In addition, although the side walls of the chip are covered with the resin, there exists only the hard substrate on the bottom surface thereof, therefore, there are such problems that the bottom surface of the chip is not protected effectively and adhesion therebetween is weak.

Further, a conventional grinding process for grinding the bottom surface of the wafer causes a grinding damage such as stress, crack and the like to arise after its mechanical processing. Because this mechanical damage leads to an occurrence of chip cracks when mounting a very thin chip on a printed board and in its handling, a process of removal of a damaged layer by polishing or chemical etching becomes necessary after the mechanical grinding.

Further, in the "DBG (dicing before grinding)" process of FIGS. 12A–12E, a chemical etching is applied after grinding the LSI wafer from its bottom surface, at this time, a chemical etching solution circulates to the device surface of the chip. Therefore, if adhesion between a double-sided adhesion sheet and the device surface of the chip 4 is weak, there occurs a serious problem that the device surface is easily etched.

The present invention is contemplated to solve the above-mentioned problems associated with the conventional art, and to provide a chip-like electronic component such as an LSI chip which may be comprised of a leading-edge LSI or a bare chip purchased from the other manufacturer, and can be mass-produced at a high yield, low cost and high reliability.

In addition, it is another object of the invention to provide a method of manufacturing the chip-like electronic components such as thin type LSI chips or the like which can minimize the damages resulting from grinding of the bottom surface of the LSI chip.

The present invention is directed to a chip-like electronic component such as a semiconductor chip having at least electrodes formed solely on one surface thereof, its side wall covered with a protective material, and its bottom surface opposite to the above-mentioned one surface is fabricated to reduce its thickness, and also the invention is directed to a pseudo wafer having a plurality of a same and/or different types of the above-mentioned chip-like electronic components which are bonded spaced apart from each other by the protective material, and the bottom surfaces opposite to their electrode surfaces are fabricated to reduce its thickness.

According to another aspect of the present invention, a method of manufacturing the pseudo wafer is provided, which is comprised of the steps of: pasting an adhesive material on a substrate, which retains an adhesive strength prior to its processing and loses the adhesive strength after its processing; fixing a plurality of a same and/or different types of semiconductor chips on this adhesive material with their surfaces having electrodes facing downward; coating a protective material on a whole area of the surfaces of the plurality of the same and/or the different types of semiconductor chips including interspatial gaps therebetween; removing the above-mentioned protective material from the bottom surface thereof opposite to the electrode surface to the bottom surface of the semiconductor chip; applying a predetermined processing to the adhesive material so as to lower the adhesive strength thereof; and peeling off a pseudo wafer having these semiconductor chips bonded thereon. In addition, a method of manufacturing a chip-like electronic component is provided, which is comprised of the step of cutting off the protective material between respective semiconductor chips on the wafer so as to divide into respective discrete semiconductor chips or chip-like electronic components.

According to the present invention, because the side surfaces of the chip-like electronic component such as the semiconductor chip or the like (hereinafter explained by referring to the semiconductor chip such as LSI chip) other than its electrode surface are protected with a protective material, the chip is ensured to be protected in its post chip handling using such as a collet, thereby facilitating its handling and enabling an excellent package reliability to be obtained. In addition, because the bottom surface of the electronic component (opposite to the electrode surface) is fabricated to reduce its thickness, an improved stack (lamination) packaging density due to a thinner structure is attained advantageously.

Further, by the method comprising the steps of: pasting on a substrate solely non-defective chips which are diced and selected from a semiconductor wafer; coating them wholly with the protective material, though a part of them is removed by grinding afterward; then peeling the wafer bonding these chips from the adhesive material, a pseudo wafer of the present invention as if comprising entirely of the non-defective chips is obtained. Therefore, a wafer batch bump treatment for these non-defective chips becomes possible, thereby allowing to form bump chips at a lower cost, and when dicing these chips from the pseudo wafer, the portion of the protective material which is easy to cut and placed between adjacent chips is cut along the scribe line thereby without causing any adverse effect (such as strain, burr, crack and the like damages) to occur on the body of these chips. In addition, because the side surfaces of these chips are coated with the protective material, an Ni electroless plating process can be executed as well. Further, not only in-house produced wafers but also bare chips purchased from the other manufacturers are allowed to be treated likewise to form the solder bump easily.

By the way, it is very rare that all of a plurality of different types of LSI chips to be packaged in an MCM are supplied from a same semiconductor manufacturer because of an increasing burden to invest on several leading edge semiconductor production lines simultaneously. Therefore, by opting not to purchase a whole bunch of chips of SRAMs, flash memories, microcomputers or even central processor units (CPUs) from the same semiconductor manufacturer, but to purchase them individually from different chip manufacturers who are most specialized in any one of these leading-edge technologies, they can be assembled in an MCM according to the present invention. In addition, the substrate described above can be used in repetition advantageously for cost reduction of bump forming and for environmental protection.

Namely, a novel process is provided according to the present invention, the same comprising the steps of: pasting a plurality (of a same type) and/or different types of LSI chips, for example, on a quartz substrate, apart from each other at a predetermined distance, with their device surfaces facing down; coating with an insulating material (such as a resin, $SiO_x$ by SOG (spin on glass)) from the bottom side of the chips, and hardening the same; reducing a total thickness by grinding or the like; and removing the pseudo wafer from the substrate, with the periphery of these chips thereon being protected by the insulating material. Thereby, this novel process of the invention enables readily to provide a method of fabricating thinner type chip components featuring a minimal damage, and an easier handling thereof.

Further, in the above-mentioned processing, the damage (such as stress, crack and the like) hardly remains even if the semiconductor chip is fabricated thinner. Further, a mechanical impact exerted on the body of the chip during packaging handling or the like is mitigated because that the sidewalls of the chip are covered with and protected by the protective material. Still further, because that respective side walls of respective chips are bonded integrally with the insulating film, there is no need of applying a chemical etching process after the grinding process as required conventionally, thereby preventing the device surface of each LSI chip from being etched by a penetrating solution.

The above-mentioned substrate made of quartz or the like can be used repeatedly, which is very advantageous in terms of cost reduction and environmental protection.

BRIEF DESCRIPTION OF THE DRAWINGS

FIGS. 1A–1K show cross-sectional views indicating sequential steps of fabricating LSI chips according to one embodiment of the invention.

PREFERRED EMBODIMENTS OF THE INVENTION

According to the present invention, the above-mentioned protective material is preferably an organic insulating resin or an inorganic insulating material. The semiconductor chip that is diced at the position of the aforementioned protective material and to be fixed on the package substrate (which chip may be a single chip or a plurality of the same or different types of chips integrated using the protective material) preferably has its device surface provided with the electrodes, its side walls covered with the protective material, and solder bumps formed on the electrodes.

Further, preferably, a single or a plurality of the same or the different types of integrated semiconductor chips to be mounted on a packaging substrate are provided by the steps of: pasting the adhesive sheet functioning as the above-mentioned adhesive material, on a flat transparent substrate or the like; fixing the plurality of the same or different types of semiconductor chips all of which are non-defective, on this adhesive sheet, with their electrode surfaces facing down; uniformly coating these semiconductor chips from their bottom surfaces with the organic insulating resin or the inorganic insulating material functioning as the or the like material, then hardening the same; grinding the above-mentioned or the like material uniformly to a level of the bottom surfaces of these semiconductor chips; then, irradiating ultraviolet rays from the bottom surface of the transparent substrate which is opposite to the other surface thereof mounting the semiconductor chips thereof, or applying a chemical solution or heating so as to weaken the adhesive strength of the adhesive sheet; peeling off a pseudo wafer having the plurality of the same or different types of semiconductor chips bonded using the protection material, from the substrate, thereby obtaining the pseudo wafer comprising the plurality of the same or different types of semiconductor chips, all of which are non-defective and arrayed thereon with their electrode surfaces exposed; and dicing the pseudo wafer at the position of the or the like material between the plurality of the same or different types of semiconductor chips so as to provide for a single semiconductor chip or an integrated semiconductor chip thereof readily to be mounted on a packaging substrate.

Still further, it may be arranged also such that only non-defective semiconductor chips which are determined to be conforming in a characteristic measurement are fixed on the above-mentioned substrate, or that only non-defective semiconductor chips or chip-like electronic components are selected from those which are subjected to the characteristic measurement in a state as bonded with each other on the substrate.

Preferred embodiments of the present invention will be described more in detail with reference to the accompanying drawings in the following.

Figure 5:
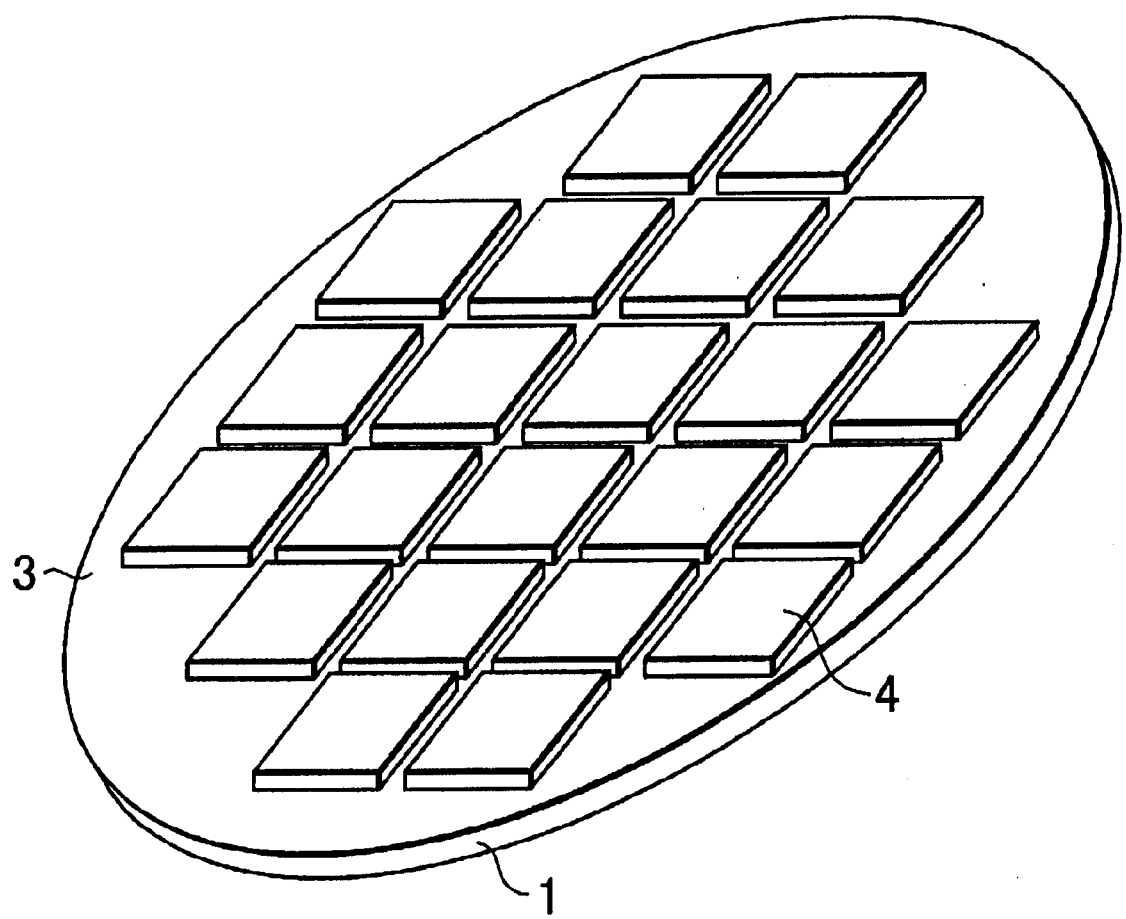
FIG. 5 is a perspective view of a quartz substrate on which only non-defective LSI chips are pasted.
Figure 6:
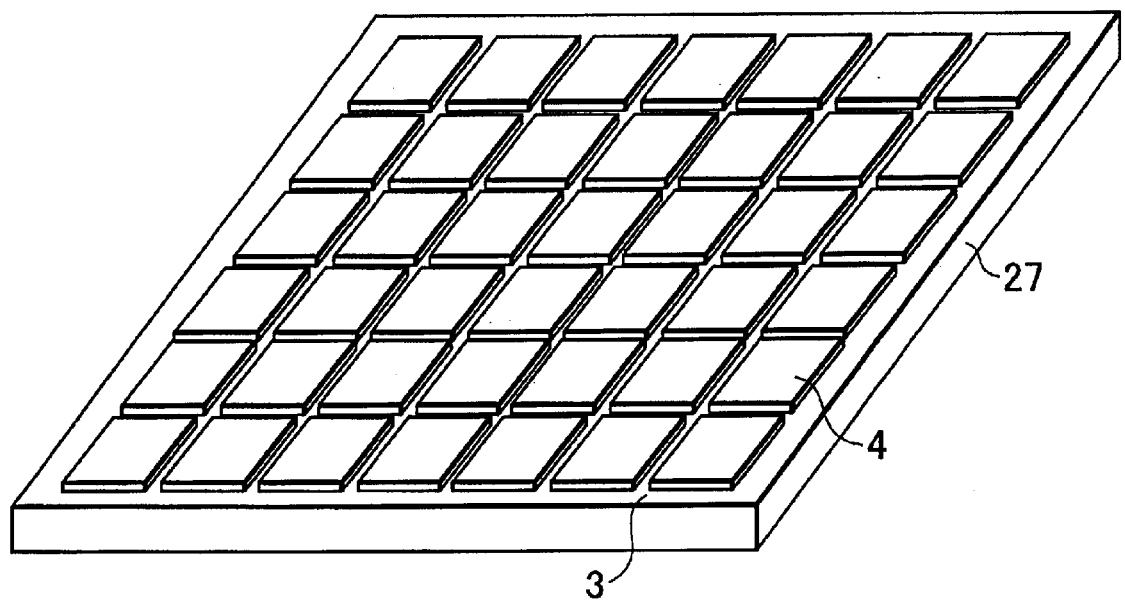
FIG. 6 is a perspective view of a large-sized glass substrate on which only non-defective LSI chips are pasted.
Figure 9:
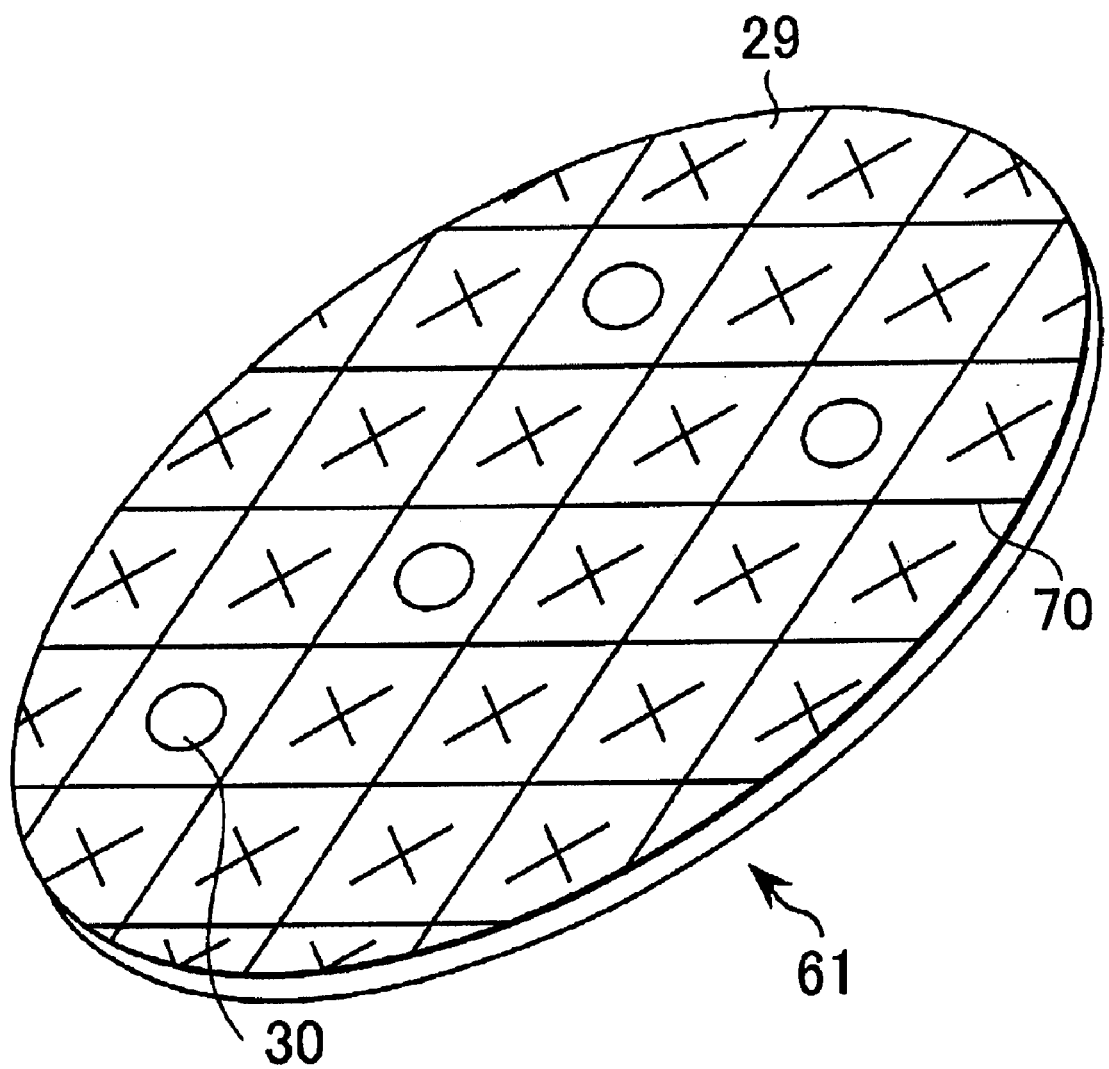
FIG. 9 is a perspective view of a conventional LSI wafer subject to a wafer batch processing.
Figure 10A:
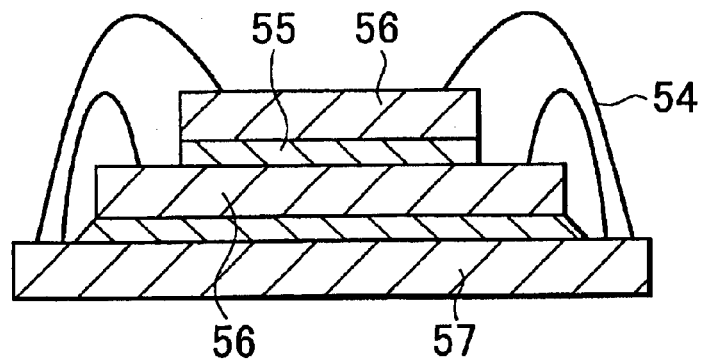
FIGS. 10A–10C are cross-sectional views indicating examples of conventional three-dimensional packaging structures.
Figure 10B:
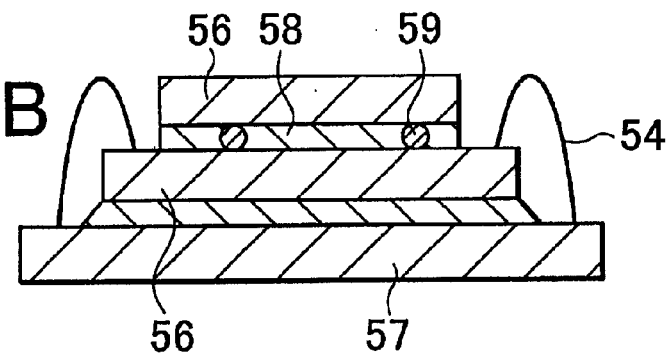
Figure 10C:
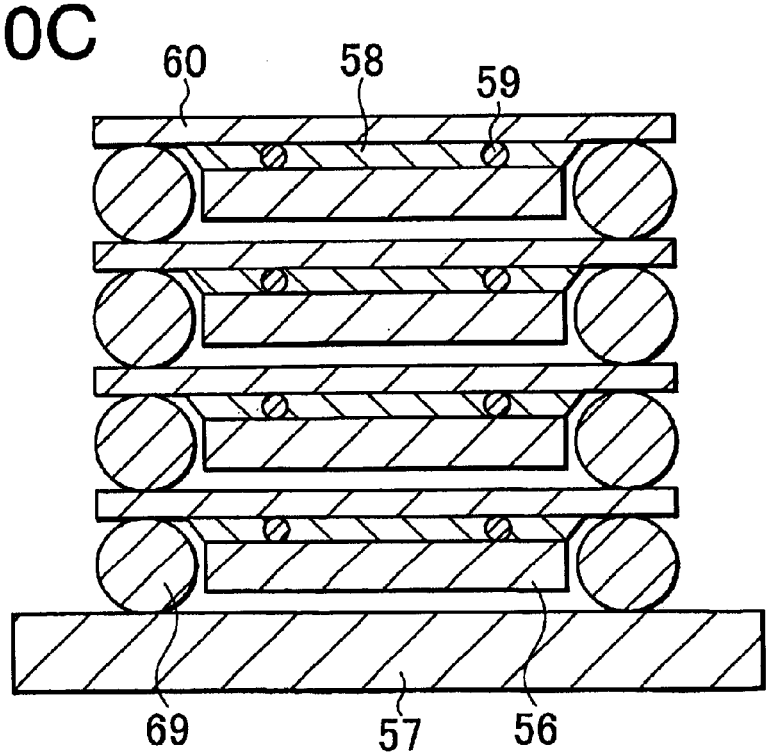
Figure 11A:
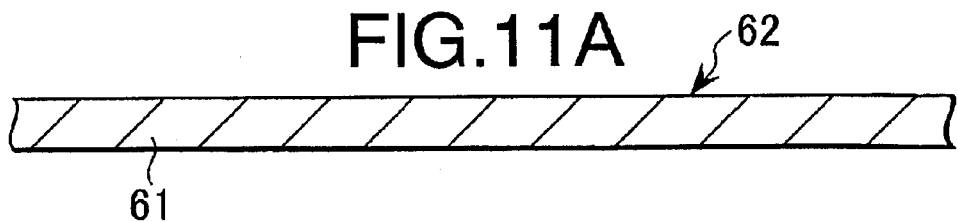
FIGS. 11A–11E are cross-sectional views indicating sequential steps of fabrication of conventional LSI chips.
Figure 11B:
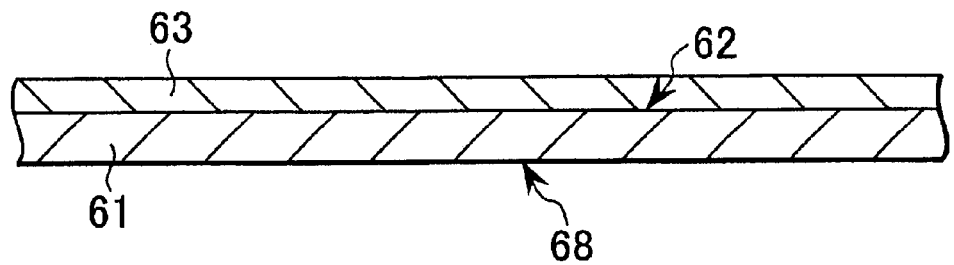
Figure 11C:
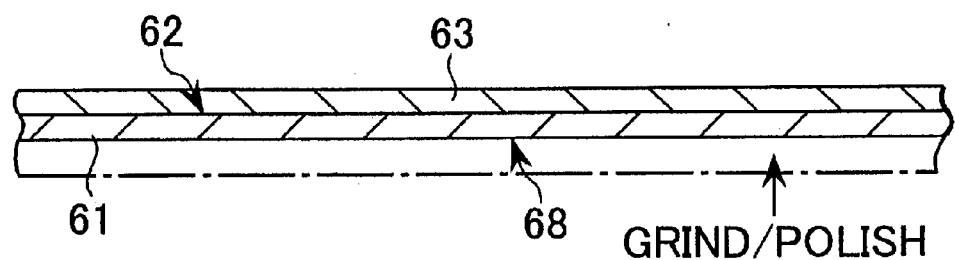
Figure 11D:
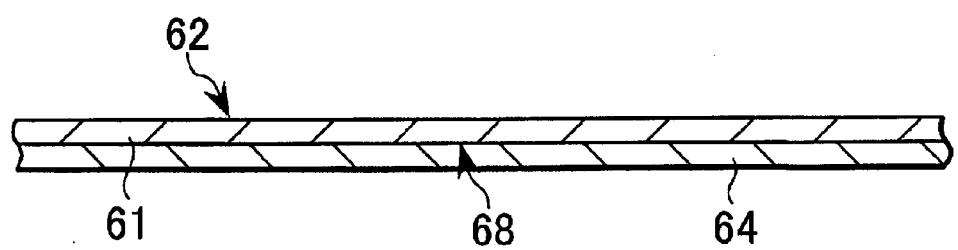
Figure 11E:
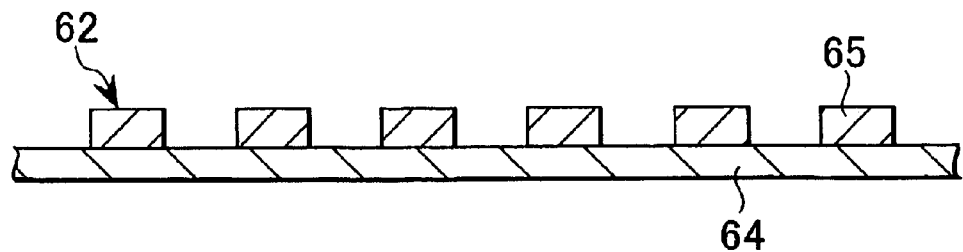
Figure 12A:
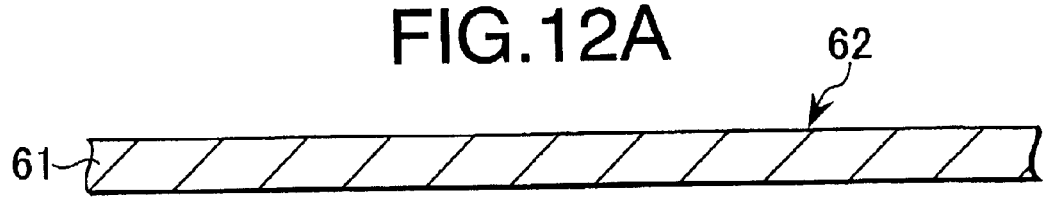
FIGS. 12A–12E are cross-sectional views indicating other sequential steps of fabrication of conventional LSI chips.
Figure 12B:
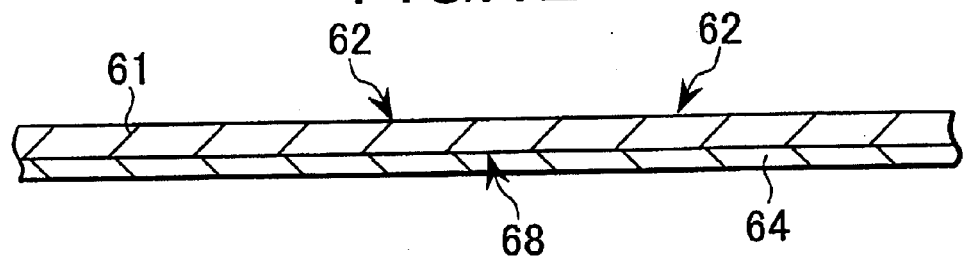
Figure 12C:
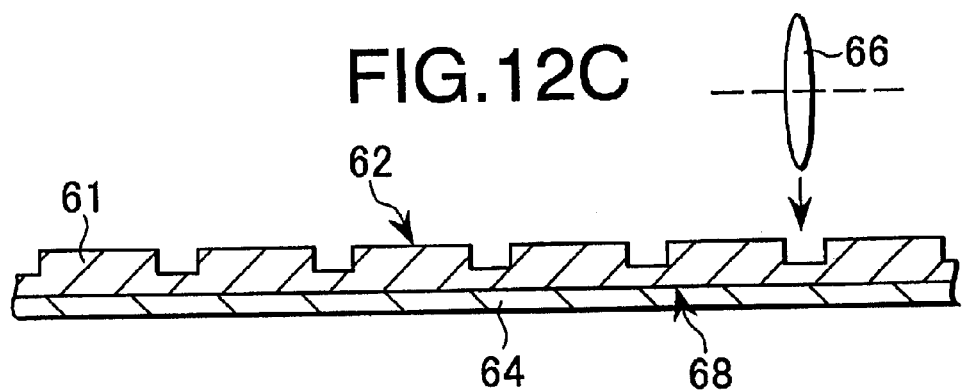
Figure 12D:
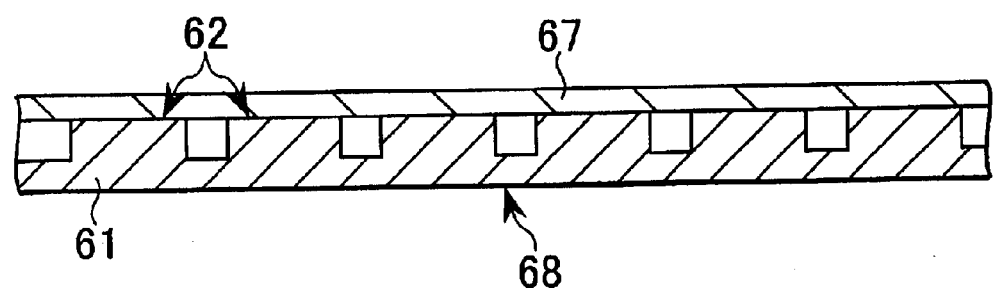
Figure 12E:
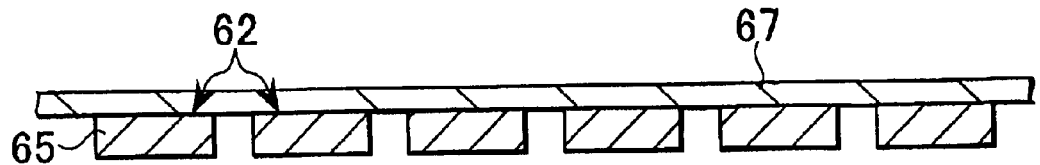

Now, with reference to FIG. 5, which shows an example of arrangements including all non-defective LSI chips 4, which were diced from LSI wafer 61 shown in FIG. 9 and confirmed to be non-defective in an open/short-circuited DC voltage measurement, then arrayed as spaced apart from each other at an equidistance, and pasted on a circular transparent substrate 1 via a double sided adhesive sheet 3. Further, FIG. 6 shows another example thereof wherein a larger-sized square glass substrate 27 is used instead of the circular quartz substrate 1 in order to allow for a greater number of non-defective LSI chips 4 to be pasted on a relatively limited area via the double sided adhesive sheet 3, thereby ensuring an improved cost merit to be attained in the subsequent processing.

A method of forming solder bumps in batch using the transparent substrate 1 of FIG. 5, including additional steps of grinding and dicing will be described in the following with reference to FIGS. 1–3.

FIGS. 1–5 show a process flow of fabricating LSI chips according to the invention.

Figure 1A:
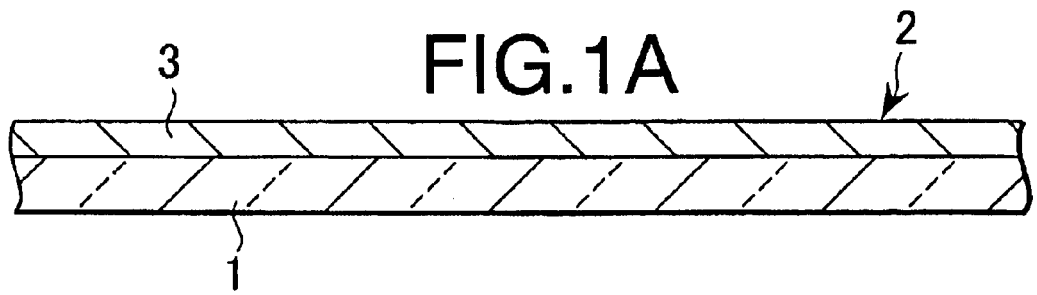
Figure 1B:
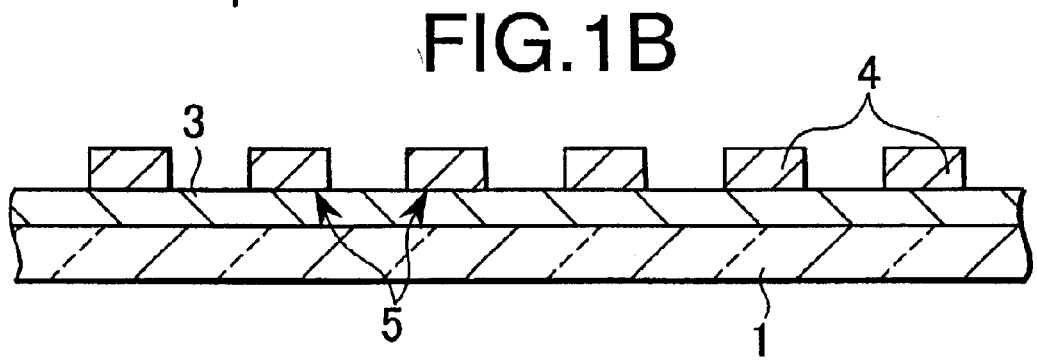
Figure 1C:
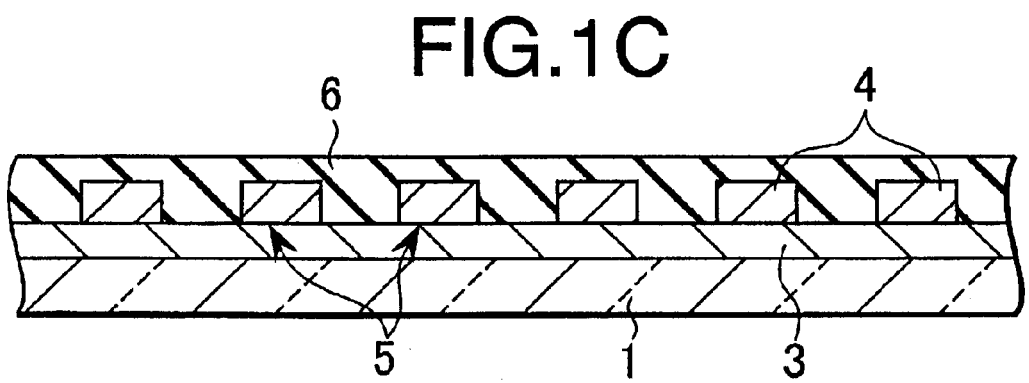
Figure 1D:
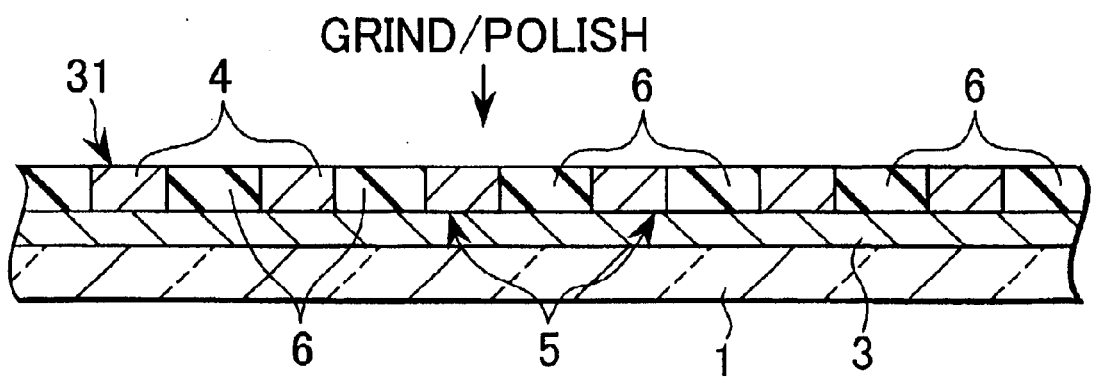

FIG. 1A shows a base substrate 2 comprising a transparent substrate 1 made of such as quartz or the like and a double sided adhesive sheet 3 pasted thereon. In FIG. 1B, a plurality of LSI chips 4 are arrayed at an equidistance from each other and pasted on the adhesive sheet 3 with their device surfaces 5 facing down. FIG. 1C shows a status thereof in which an insulating film 6 such as resin, SOG or the like is uniformly coated from the upper direction thereof by printing or spin coat methods. In FIG. 1D, the insulating film (resin or SOG) 6 which was hardened by heating or the like is ground and polished to reduce its thickness.

By the way, a glass substrate which is less costly can be used because its heating process is performed at temperatures lower than 400° C. Further, this transparent substrate 1 can be used repeatedly.

Further, as the double sided adhesive sheet 3, such one made of acrylic or the like which is used in a normal dicing process and loses its adhesive strength when irradiated with ultraviolet rays is pasted on the quartz substrate 1.

Further, all of the LSI chips 4 shown in FIG. 1B and pasted on the transparent substrate are verified to be non-defective in advance. These non-defective LSI chips 4 may be picked up selectively from an extended dicing sheet (not shown) subjected to dicing in its normal wafer processing, or may be transferred from a chip tray. What is important and to be noted here is that notwithstanding whether they are manufactured in-house or by the other manufacturers, only the non-defective bare chips 4 are allowed to be rearranged on the transparent substrate 1.

Still further, the grinding process described above is not limited to the mechanical grinder processing, thus, polishing or chemical etching processes may be used to remove a damaged layer as well. However, in the above-mentioned processes, because the periphery of the LSI chip 4 is covered with the insulating film 6, it should be noted that any attack on the device surface 5 during the etching process described with reference to the "DBG (dicing before grinding)"0 of FIGS. 12A–12E is completely eliminated advantageously.

Next, in FIG. 1E, with a dicing sheet 8 pasted on the grinding surface 7, when the ultraviolet rays are irradiated from the bottom side of the transparent glass substrate 1 in a direction as indicated by arrows, the adhesive strength between the device surface 5 of the LSI chip 4 and the double sided adhesive sheet 3 is weakened so as easily to allow separation therebetween.

Namely, ultraviolet rays are irradiated from the bottom side 32 of the quartz substrate 1 so as to weaken the adhesive strength of the adhesive sheet, then a pseudo wafer 24 comprising a plurality of non-defective LSI chips 4, the side walls of which are bonded with the insulating film 6, is peeled off from the transparent substrate 1 along the adhesion surface 33, while retaining the dicing sheet 8 thereon.

In the next step shown in FIG. 1F, the pseudo wafer 24 is turned over so as to cause a non-defective LSI chip's surface (device surface) 5 to face upward. The pseudo wafer 24 as partially enlarged in FIG. 1G has an Al electrode pad 10 and a passivation film 12 formed on the silicon substrate via a $SiO_2$ film 11.

Figure 1I:
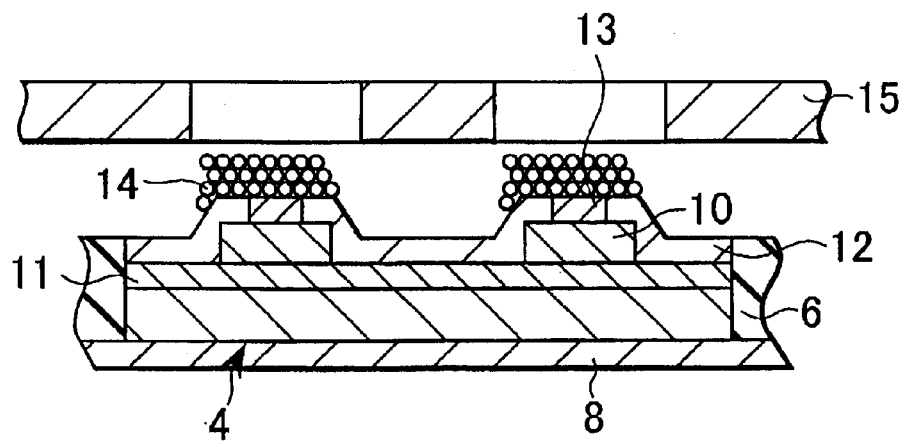
Figure 1J:
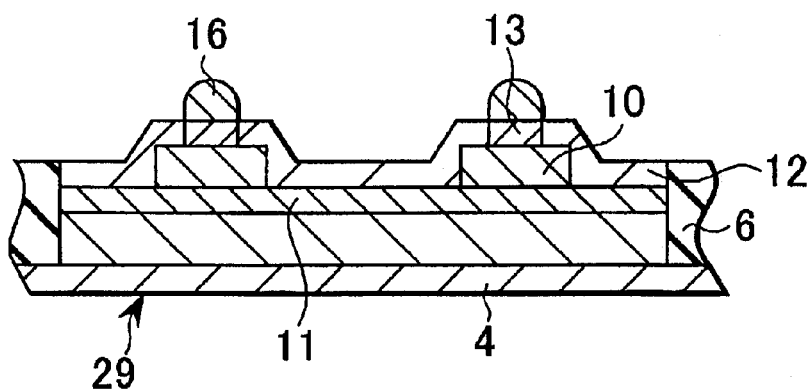

Then, the steps of processing shown in FIGS. 1H–1J are executed. FIG. 1H shows processing of an Ni electroless plating layer 13 which serves as a UBM (under bump metal), FIG. 1I shows a print/transfer of a solder paste 14 using a print mask 15, and FIG. 1J shows a process of forming a solder bump 16 by a wet back method.

Namely, in the step of FIG. 1H, only on the surface of an Al electrode pad 10 which is exposed, a Ni electroless plating layer (UBM) 13 is formed selectively by the Ni electroless plating method. This Ni electroless plating layer (UBM) 13 is easily formed by the steps of: pretreating the upper surface of the Al electrode pad 10 with a phosphoric acid etching solution; then precipitating Zn by a zinc substitution process; and dipping in an Ni—P plating vessel. This Ni electroless plating layer functions as a UBM (under bump metal) which facilitates electric connection between the Al electrode pad 10 and the solder bump 16 (to be described later).

FIG. 1I shows a state of a solder paste 14 which was transferred via a print mask 15 onto the Ni electroless plated layer (UBM) 13 by the printing method. FIG. 1J shows a state in which the solder paste 14 was fused by the wet back method to form a solder bump 16. As described above, the solder bump 16 can be formed easily using the Ni electroless plating method and the solder paste screen printing method or the like, without using the photo process.

Then, in order to remove flux or residual of the solder paste 14 after forming the solder bump 16, a cleaning process is added to. By the way, any detergent, facilities and conditions can be selected at discretion for this cleaning process if it has a sufficient cleaning effect.

According to the steps of fabrication described above, even if the LSI chips to be fabricated are leading-edge LSIs which normally have a low yield, or purchased from the other manufacturers, if only non-defective LSI chips 4 selected from among them are pasted again on the transparent substrate 1 to provide for a pseudo wafer 24 which has, as if, only 100% non-defective LSI chips 4 from the beginning, then, a wafer batch bump forming is enabled to perform, thereby reducing the fabrication cost substantially.

Further, in the step of FIG. 1J, by carrying out measurements on electrical characteristics of the non-defective LSI chips by a probe inspection, and a burn-in processing, a more precise selection only of the non-defective LSI chips 4 which already passed a primary selection prior to the step of FIG. 1C will be further ensured.

Figure 1K:
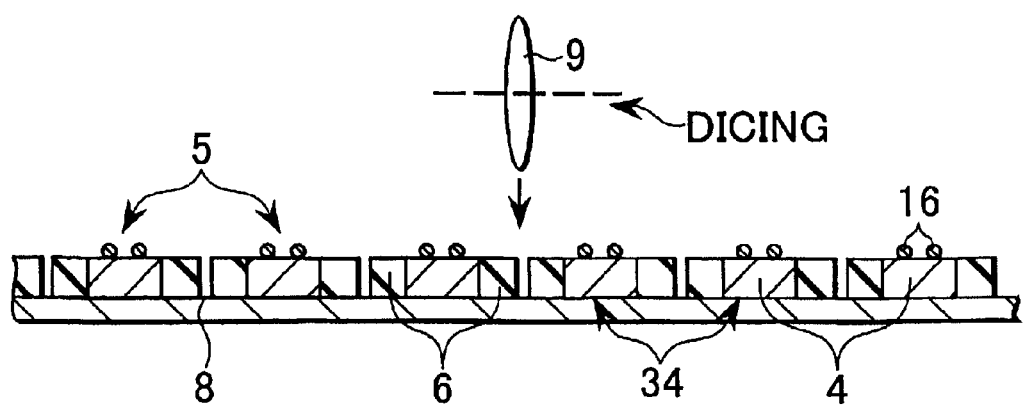

FIG. 1K shows a step of dicing the wafer into a unit of non-defective LSI chip components 34 each having the solder bump 16 formed thereon and the side wall thereof protected and reinforced by the insulating film 6. The dicing into respective chips is carried out along a scribe line (which exists in a region of the insulating film 6) on the pseudo wafer 24 having the dicing sheet 8 still attached thereto, and using a blade 9 (or a laser beam).

Namely, in FIG. 1K, the non-defective LSI chips 4 rearranged and contained in the pseudo wafer 24 are diced again into discrete chips by cutting through in the portion of the insulating film 6 which covers the side walls of the LSI chips 4, using the dicing blade 9 or a laser beam.

Thereby, according to the above-mentioned processing, because the side walls of the non-defective LSI chips 4 are covered with insulating film 6, there occurs no direct damage to the LSI chips 4 during the grinding and the dicing of the pseudo wafer 24 to follow, thereby ensuring thin type LSI chip components having a stable quality to be obtained.

Further, if the etching process is applied after grinding, a chemical attack on the device surface is prevented because the insulating film 6 prevents penetration of the etching solution to the device surface. Still further, because the bottom surface of the LSI chip component 34 is ground and exposed, the bottom surface of the LSI chip component may be coated with an insulating film again for protection thereof after the above-mentioned processing.

Figure 2:
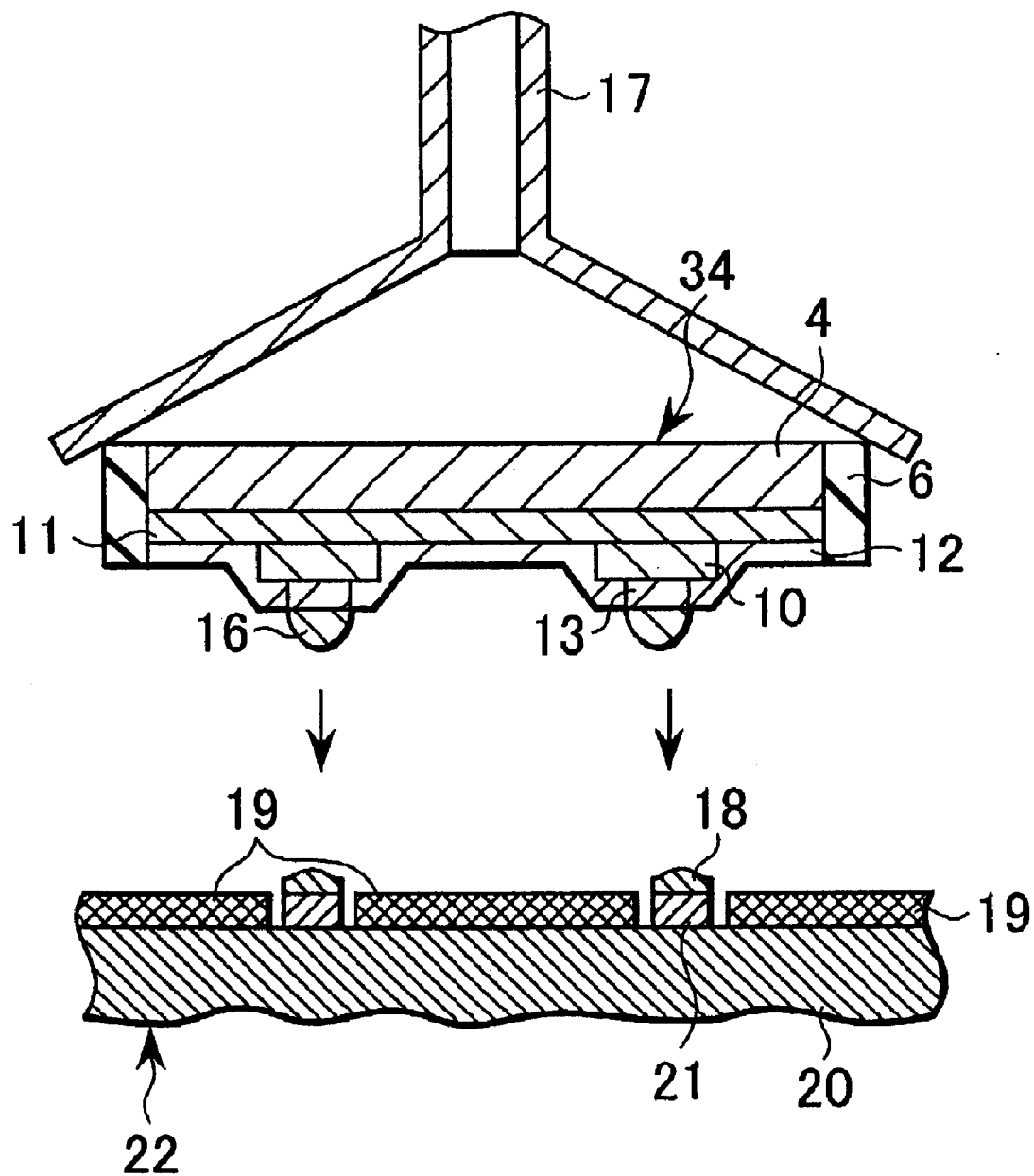
FIG. 2 is a cross-sectional view indicating the step of packaging of the same.

In the next step of FIG. 2, a non-defective LSI chip component 34 diced into an individual chip is mounted on a packaging substrate 22 in alignment with an electrode 21 which is surrounded by a solder resist 19 on the surface of a wiring substrate 20, and coated with the solder paste 18.

At this time, because the side wall of the non-defective LSI chip component 34 is covered with the insulating film 6, no direct damage is given to the non-defective LSI chip component 34 during the process of mounting thereof on the packaging substrate 22 by the adsorption handling or the like using a collet 17. Therefore, a high reliability flip chip packaging is expected to be done.

Figure 3:
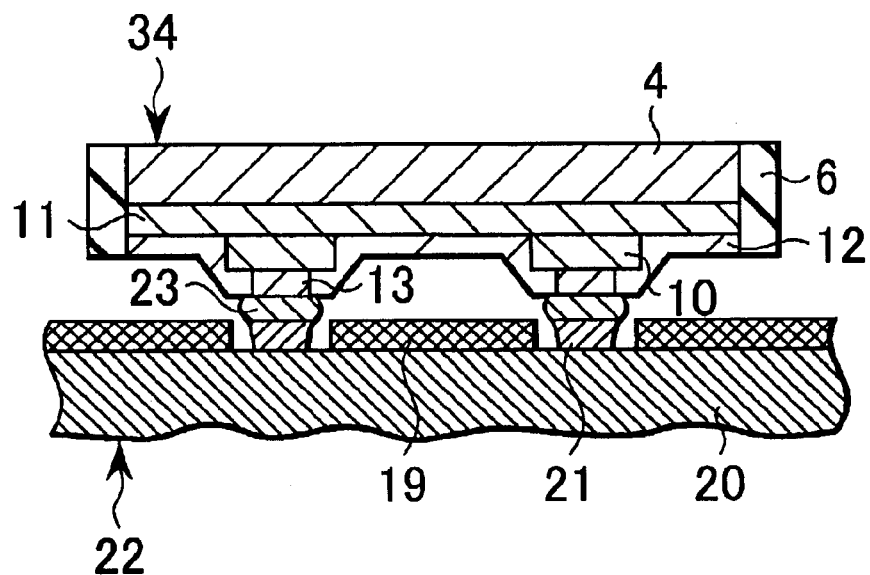
FIG. 3 is a cross-sectional view indicating a packaging state of the same.

In the next, FIG. 3 shows a mode of packaging of a thin type LSI chip component 34 having solder bumps 16 formed on the packaging substrate 22 by the flip chip method, wherein because a contact portion of the thin type LSI chip component 34 to be chucked by the collet 17 is physically limited to the portion of the insulating film 6, no direct contact with the body of the LSI chip 4 of the thin type LSI chip component 34 occurs thereby minimizing a damage to the thin type LSI chip component 34 during the packaging handling.

By way of example, the above description is related to the flip chip packaging technology for packaging the LSI chips or the like, however, it is also related to the solder bump forming technology and its method for forming interconnection solder bumps in the flip chip high density packaging, comprising the steps of: arranging the non-defective LSI chips 4 on the transparent substrate 1 spaced apart from each other at an equidistance with their device surfaces facing down, and pasting the same on the transparent substrate 1; and uniformly coating the bottom surfaces and the like thereof with the insulating film (such as resin and SOG) 6 thereby retaining respective non-defective LSI chips 4 bonded with each other.

Then, after grinding the bottom surface thereof, the wafer is peeled off from the double surface adhesive sheet 3 to provide for the pseudo wafer 24 on which only the non-defective LSI chips 4 are arrayed. Subsequently, solder bumps are formed over this pseudo wafer 24 in batch thereby enabling for the bump chips to be fabricated at a low cost. This low cost bump chip can be used not only in compact and lightweight portable devices but also in any types of electronic devices.

Figure 4:
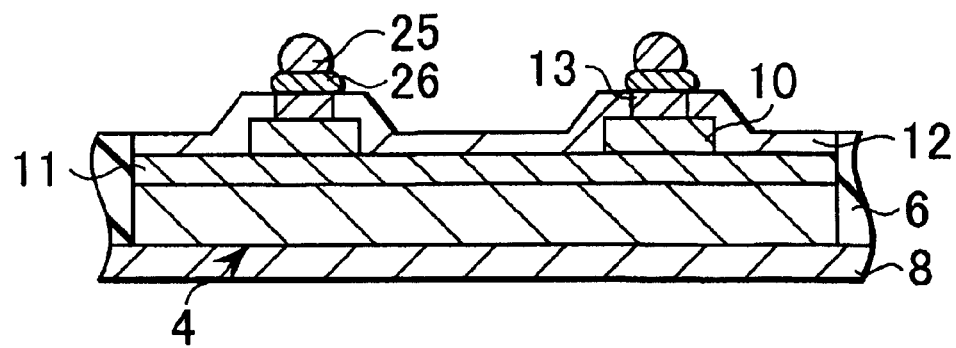
FIG. 4 is a cross-sectional view of a pseudo wafer in which a metal ball is used instead of solder paste.

FIG. 4 shows an example of modified bump forming methods according to the present invention, in which instead of the above-mentioned solder paste 14, a metal ball (solder ball) 25 is used.

Namely, a passivation film 12 which covers an Al electrode pad 10 formed on a pseudo wafer 24 is perforated at a position where a bump electrode is to be formed, and in which a Ni electroless plating layer (UBM) 13 is formed.

Then, a flux 26 is coated on this Ni electroless plating layer (UBM) 13 by the printing method or the like. A material suitable for this flux 25 has preferably an appropriate adhesive strength to enable an easy transfer of the metal ball 25, and its quantity of coating is sufficient if it can retain the metal ball 25. Further, although the method of coating of the flux 26 is not limited to the printing method, in practice, however, the printing method is preferred. It is because that in comparison with the other methods, the printing method can coat the flux 26 in a predetermined pattern more easily and more efficiently.

Further, the metal ball 25 as mounted on the flux 26 is subjected to a reflow (fusing) process, and then the flux 26 is cleaned. Thereby, the metal ball 25 is firmly bonded with the Ni electroless plating layer (UBM) 13, thereby completing the process of forming the bump electrodes according to the present invention.

As described hereinabove, according to this embodiment of the present invention, because that the non-defective LSI chips diced from the wafer are rearranged and pasted on the transparent substrate at a equidistance from each other, then after coating with the insulating film and grinding the bottom surface thereof, the pseudo wafer as if having all the non-defective LSI chips from the beginning is obtained upon peeling off from the transparent substrate. Therefore, the wafer batch processing for forming solder bumps on the plurality of the non-defective LSI chips arrayed on the pseudo wafer becomes possible, thereby enabling the solder bumps to be formed on the flip chip at a low cost. Further, not only the in-house produced wafers but also bare chips purchased from the other manufacturers can be processed likewise to form solder bumps thereon easily according to the present invention.

Still further, because that the side walls of the LSI chips are covered with the insulating film and protected thereby, even the Ni electroless plating process becomes possible, and an improved package reliability is ensured even in a package handling by collet absorption or the like of the LSI chips after dicing into discrete chip components. Further, because the substrate used for pasting non-defective chips can be used repeatedly after peeling the pseudo wafer, it is advantageous for cost reduction of the bump forming and environmental protection.

Furthermore, the merit and the advantage of the low cost bump processing based on the wafer batch processing according to the present invention can be utilized in processing of the leading-edge LSIs or bare chips purchased from the other manufacturer, thereby providing a novel bump forming method which is widely applicable. In addition, when dicing respective LSI chips from the pseudo wafer, because they are cut into pieces solely at the position of the insulating film, the dicing is carried out easily without damaging the cutter blade and minimizing adverse effects (strain, burr, crack or the like damages) on the body of the LSI chips.

Figure 7:
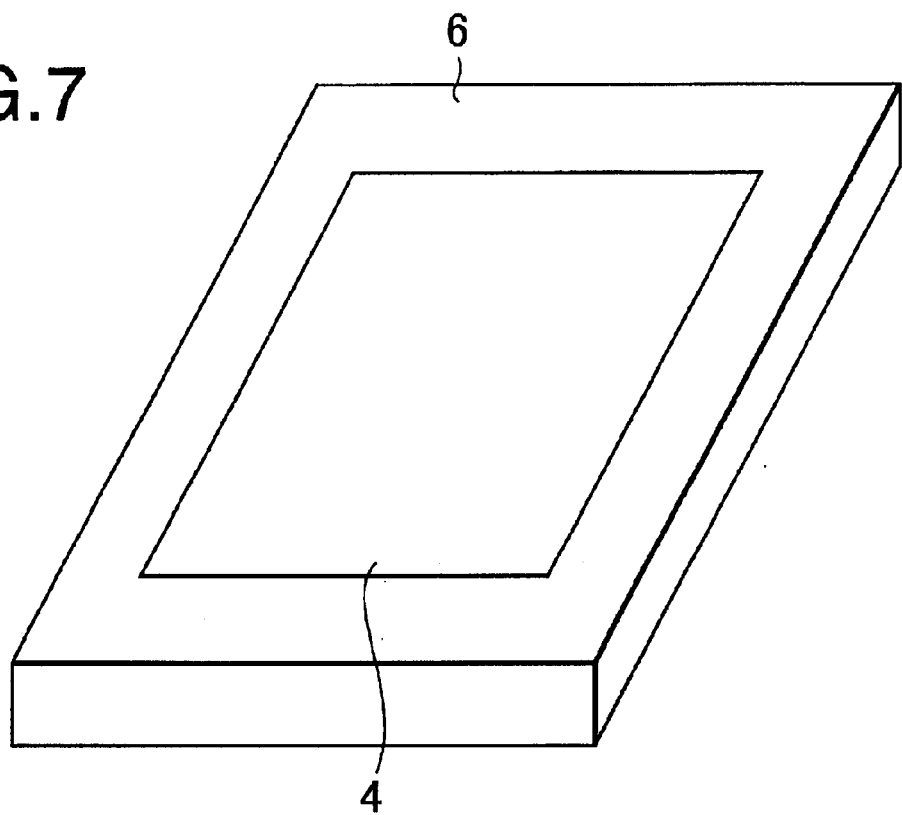
FIG. 7 is a perspective view of a thin type LSI chip of the invention.
Figure 8:
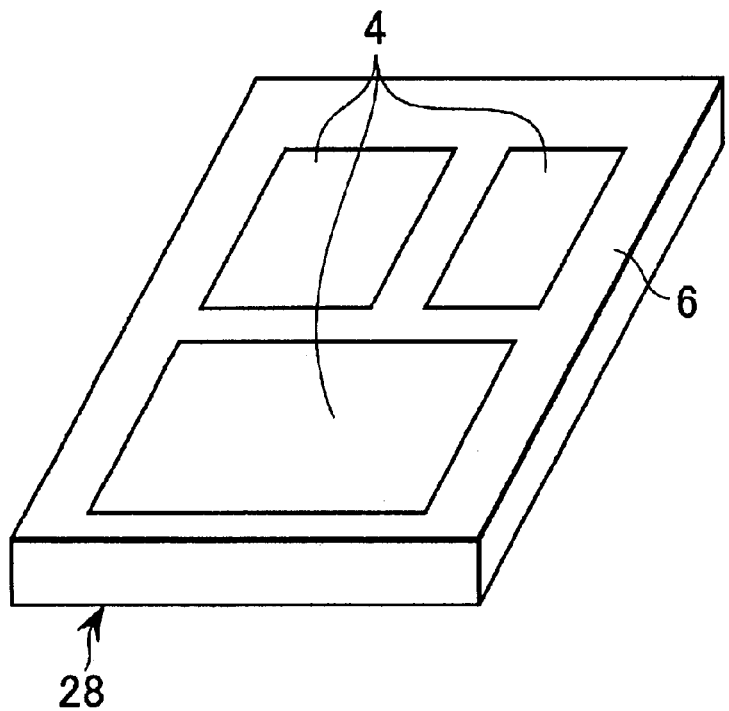
FIG. 8 is a perspective view of an example of MCMs (multi chip modules) of the invention.

LSI chip components 34 are described schematically in the following two diagrams, wherein FIG. 7 shows a thin type LSI chip, and FIG. 8 shows a thin type module which is obtained by pasting a plurality of the same or different types of LSI chips on a transparent substrate spaced apart from each other at a predetermined distance, then subjecting to grinding to reduce the thickness of the module as will be done to a single LSI unit.

By the way, FIG. 8 shows such an example of thin type modules having a basic module structure that it is not a single LSI chip but it is a plurality of the same or different types of LSI chips that constitutes its LSI chip component, which are contained therein and arranged spaced apart from each other at a predetermined distance.

Then, the thin type pseudo wafer arraying at an equidistance thereon the non-defective LSI chips with solder bumps, or the thin type pseudo wafer arraying the plurality of the same or different types of LSI chips in a unit of module spaced apart from each other at a predetermined distance, are diced again into respective chips using a blade or a laser beam so as to provide for respective thin type LSI chip components each having bumps attached thereto, and the side walls of the LSI chips being covered with the insulating substance (such as resin, SOG or the like), or the thin type modules comprising the same.

The above-mentioned technology of the invention also relates to a method of providing a thin type LSI chip packaging technology.

More specifically, the present invention relates to the method of manufacturing the thin type LSI chips and LSI chip components suitable for use in the flip chip high density packaging, which features the minimized damages, and is comprised of the steps of: arranging the plurality of non-defective LSI chips spaced apart from each other at an equidistance and pasting them on the double sided adhesive tape pasted on the transparent substrate, with their device surfaces facing down; uniformly coating the same from the bottom surfaces thereof with the insulating film (such as resin, SOG or the like) thereby bonding the plurality of the non-defective LSI chips together as embedded in the insulating film; fabricating the LSI chips to reduce its thickness by grinding or etching; then peeling the pseudo wafer from the double sided adhesive tape, and dicing the wafer into respective thin type LSI chip components.

The thin type LSI chip components obtained as above can be used not only in the compact and lightweight portable electronic devices but also in any types of electronics devices.

Still further, according to the present invention, the solder bump LSI chips suitable for a low cost flip chip processing can be obtained by the provision of the pseudo wafer which is comprised solely of the non-defective LSI chips which can be processed in wafer batch. The method of fabricating the solder bump LSI chips comprises the steps of: rearranging the plurality of non-defective LSI chips on the transparent substrate; pasting the same thereon via the adhesive sheet which can readily peel off afterward when obtaining the pseudo wafer; and forming the solder bumps on the LSI chips in wafer batch processing. Furthermore, not only the in-house produced LSI wafers but also the LSI chips purchased from the other manufacturer can be processed likewise easily to form solder bumps thereon.

Further, because the side walls of these LSI chips are covered with the insulating material, the damages due to stress or the like are minimized in the subsequent processing such as grinding, polishing and in the production of the thin type LSI chips. Still further, because the side walls of these LSI chips are protected by the insulating material, the body of the diced LSI chips can be protected from damages during the packaging handling using the collet or the like, thereby ensuring an improved packaging reliability to be attained. Furthermore, the transparent substrate can be used repeatedly, advantageously for cost reduction of bump fabrication and environmentally.

In addition, because the side walls of these LSI chips are covered with the insulating material to prevent penetration of the chemical solution to the device surface, there occurs no etching of the device surface even if the etching process is applied after the grinding process.

The preferred embodiments of the present invention described hereinabove are not limited thereto, and it should be noted that many other modifications can be contemplated to the same effect within the scope of the invention.

For example, the substrate on which to paste the non-defective LSI chips may be any other material if it has the same function and the same strength as those of quartz or glass. Further, the size and thickness of the substrate may be modified at discretion. Though it depends on the types of the adhesive sheet 3, this substrate is not limited to those which allow transmission of ultraviolet rays, and opaque materials, in other word, materials not optically transparent, may also be used if this adhesive sheet can peel easily by application of heating or a chemical solution. The double surfaced adhesive sheet 3 may be any material other than acrylic if it has the same function as that, and also the insulating film 6 may be selected from a wide range of materials other than SOG and the resin. In addition, the distance at which the plurality of the non-defective LSI chips are to be spaced apart may be selected at discretion if it is equidistant.

Still further, because the above-mentioned transparent substrate 1 or the like can be used repeatedly, it is advantageous for the cost reduction and environmentally. Furthermore, the object of application of the present invention is not limited to the LSI chips, but includes any other types of chip-like electronic components involving the process of dicing into individual chips.

Conclusively, there have been accomplished such advantages according to the present invention that the adverse effects (strain, burr, and/or cracking damage) on the body of the chip-like electronic components are minimized by provision of the method which comprises the steps of: pasting on the substrate the adhesive material having the property to retain its adhesive strength prior to its processing and lose its adhesive strength after its processing; bonding the plurality of the same and/or different types of semiconductor chips on this adhesive material, with their electrode surfaces facing down; coating the whole area of these semiconductor chips including the gaps therebetween with the protection/passivation material; removing the protection material from the side thereof opposite to their electrode surfaces to the level of the bottom surfaces of these semiconductor chips; applying the predetermined processing to the adhesive material to weaken its adhesive strength; peeling off the pseudo wafer having the plurality of semiconductor chips bonded at their side walls with the protection material; dicing the pseudo wafer into units of individual semiconductor chips or chip-like electronic components by cutting the protection material between respective semiconductor chips according to their requirements, thereby suppressing direct damages to the body of the chip-like electronic components which are protected by the protection material at their side walls.

There are still another advantage that the wafer as if having solely the non-defective chips is provided by dicing the non-defective chip-like electronic components from the pseudo wafer and rearranging the same on the wafer, for enabling to form the solder bumps in the wafer batch processing, thereby allowing to form the flip chip solder bump chips at a lower cost. Still further, not only the in-house produced wafers but also the bare chips purchased from the other manufacturer can be processed likewise easily to form solder bumps and the like.

Still more, because that the side walls of chips are covered with the protective material and protected thereby, it also becomes possible to apply the Ni electroless plating, and an excellent packaging reliability is ensured during the packaging handling of the diced chips. In addition, because that the bottom surfaces of the chips are fabricated into a thinner thickness, an improved density of lamination packaging is realized.

Furthermore, because the steps of grinding and polishing of the protective material are executed in the state in which both the side walls and the bottom surfaces of the chip-like electronic components are covered with the protective material, the damage to the chips due to these steps of processing is minimized thereby successfully completing the thinner thickness fabrication thereof. Also, because penetration of the solution to the device surface of the LSI chips is prevented, no deterioration on the device surfaces takes place, and no impairment in functions occurs.

What is claimed is:

1. A method of manufacturing chip-like electronic components comprising the steps of:

pasting an adhesive material on a substrate, said adhesive material having a property to retain an adhesive strength prior to a processing and to lose said adhesive strength after said processing;

fixing a plurality of a same or different types of semiconductor chips on said adhesive material with an electrode surface thereof facing down;

coating a whole area including said plurality of the same or different types of semiconductor chips and a gap therebetween with a protective material;

removing said protective material from a side thereof opposite to said electrode surface to a level of a surface of the semiconductor chips;

applying a predetermined process to said adhesive material to weaken said adhesive strength of said adhesive material so as to peel off a pseudo wafer comprising said plurality of same or different types of semiconductor chips; and dicing said plurality of the same or said different types of semiconductor chips into each semiconductor chip or each chip-like electronic component by cutting said protective material in said gap therebetween.

2. The method of manufacturing a chip-like electronic components according to claim 1, wherein:

said substrate has a flat surface;

said adhesive material is an adhesive sheet;

said plurality of the same or different types of semiconductor chips bonded on said adhesive sheet are non-defective;

said protective material is either one of an organic insulating material and an inorganic insulating material, and is uniformly coated on said semiconductor chips;

said protective material is uniformly ground to a level of the of said semiconductor chips;

said predetermined process includes irradiating ultraviolet rays on said adhesive sheet through said flat substrate from a bottom surface thereof opposite to the surface on which said plurality of semiconductor chips are bonded, or applying a chemical solution or heating the same to weaken said adhesive strength of said adhesive sheet so as to peel off a pseudo wafer having said plurality of the same or different types of semiconductor chips bonded integrally and covered with said protective material, from said flat substrate, said plurality of the same or different types of semiconductor chips bonded integrally on said pseudo wafer being totally non-defective and arrayed thereon with their electrode surfaces exposed; and further said pseudo wafer is diced between said plurality of the same or different types of semiconductor chips.

3. The method of manufacturing a chip-like electronic components according to claim 1, further comprising the steps of: dicing said pseudo wafer at a position of said protective material between said plurality of the same or said plurality of different types of semiconductor chips; and integrating a plurality of a same or different types of semiconductor chips to be mounted on a packaging substrate.

4. The method of manufacturing a chip-like electronic components according to claim 3, further comprising the step of forming solder bumps on said electrodes.

5. The method of manufacturing a chip-like electronic components according to claim 1, further comprising the step of bonding on said substrate said plurality of semiconductor chips which are determined to be non-defective in a characteristic measurement thereof.

6. The method of manufacturing a chip-like electronic components according to claim 1, further comprising the steps of: carrying out said characteristic measurement on said plurality of semiconductor chips in a state they are bonded with said protective material; and selecting non-defective semiconductor chips or non-defective chip-like electronic components.

7. The method of manufacturing chip-like electronic components according to claim 1 and further wherein the substrate is a solid material.

8. A method of manufacturing a pseudo wafer comprising the steps of:

pasting an adhesive material on a substrate, said material having a property to retain an adhesive strength prior to a processing and lose said adhesive strength after said processing;

bonding on said adhesive material a plurality of a same or different types of semiconductor chips with their electrode surfaces facing downward;

coating with a protective material a whole area of said plurality of the same or different types of semiconductor chips including a gap therebetween;

removing said protective material from a side opposite to said electrode surfaces to a level of the surfaces of the semiconductor chips; and applying a predetermined process to said adhesive material to weaken its adhesive strength so as to peel off a pseudo wafer on which said plurality of the same or different types of semiconductor chips are bonded.

9. The method of manufacturing a pseudo wafer according to claim 8, wherein:

said substrate has a flat surface;

said adhesive material is an adhesive sheet;

said plurality of the same or different types of semiconductor chips bonded on said adhesive sheet with their electrode surfaces facing downward are non-defective;

said protective material is either one of an organic insulating resin or an inorganic insulating material functioning, and is uniformly coated on said semiconductor chips;

said protective material is uniformly ground to a level of surfaces of said semiconductor chips;

said predetermined process includes irradiating ultraviolet rays, through said substrate, on said adhesive sheet from a side thereof opposite to the surface thereof bonding said plurality of the same or different types of semiconductor chips thereon, or applying a chemical solution thereto or heating said adhesive sheet to weaken the adhesive strength of said adhesive sheet so as to peel off a pseudo wafer having said plurality of the same or different types of semiconductor chips bonded with said protection material from said substrate; and thereby said pseudo wafer having said plurality of the same or different types of non-defective semiconductor chips arrayed thereon, with their electrode surfaces exposed is obtained.

10. The method of manufacturing a pseudo wafer according to claim 8, further comprising the step of forming a solder bump on said electrode.

11. The method of manufacturing a pseudo wafer according to claim 8, further comprising the step of bonding on said substrate said semiconductor chips which are determined to be non-defective in characteristic measurements thereof.

12. The method of manufacturing a pseudo wafer according to claim 8, comprising the steps of:

carrying out a characteristic measurement on said semiconductor chips in a state as they are bonded with said protective material; and selecting non-defective semiconductor chips or non-defective chip-like electronic components therefrom.

13. The method of manufacturing a pseudo-wafer according to claim 8, and further wherein the substrate is a solid material.

* * * * *